(12) United States Patent
Tanaka et al.

(10) Patent No.: US 10,900,854 B2
(45) Date of Patent: Jan. 26, 2021

(54) PRESSURE SENSOR AND METHOD OF PRODUCING THE SAME

(71) Applicant: TOHOKU UNIVERSITY, Sendai (JP)

(72) Inventors: Shuji Tanaka, Sendai (JP); Joerg Froemel, Sendai (JP)

(73) Assignee: Tohoku University, Miyagi (JP)

( * ) Notice: Subject to any disclaimer, the term of this patent is extended or adjusted under 35 U.S.C. 154(b) by 307 days.

(21) Appl. No.: 16/337,029

(22) PCT Filed: Mar. 27, 2017

(86) PCT No.: PCT/JP2017/012492
§ 371 (c)(1),
(2) Date: Mar. 27, 2019

(87) PCT Pub. No.: WO2017/170456
PCT Pub. Date: Oct. 5, 2017

(65) Prior Publication Data
US 2019/0301956 A1  Oct. 3, 2019

(30) Foreign Application Priority Data
Mar. 28, 2016 (JP) .................. 2016-064778

(51) Int. Cl.
*G01L 9/12* (2006.01)
*B81C 1/00* (2006.01)
(Continued)

(52) U.S. Cl.
CPC .............. *G01L 9/12* (2013.01); *B81C 1/0015* (2013.01); *G01L 9/00* (2013.01); *G01L 23/12* (2013.01);
(Continued)

(58) Field of Classification Search
CPC ... G01L 9/12; G01L 9/00; G01L 23/12; G01L 9/0072; H04R 19/00; H04R 31/00;
(Continued)

(56) References Cited

U.S. PATENT DOCUMENTS

| 5,870,482 A | 2/1999 | Loeppert et al. |
| 7,863,714 B2 | 1/2011 | Diamond et al. |

(Continued)

FOREIGN PATENT DOCUMENTS

| JP | 62-233999 A | 10/1987 |
| JP | 2004-045048 A | 2/2004 |

(Continued)

OTHER PUBLICATIONS

Loeppert et al., "SiSonic(TM)—The First Commercialized MEMS Microphone", Solid-State Sensors, Actuators, and Microsystems Workshop, Hilton Head Island, South Carolina, Jun. 4-8, 2006, pp. 27-30.

(Continued)

*Primary Examiner* — David Z Huang
(74) *Attorney, Agent, or Firm* — Morgan, Lewis & Bockius LLP

(57) ABSTRACT

Provided are a pressure sensor which exhibits exceptional performance and a method of producing the same. The pressure sensor includes: a silicon substrate having a cavity; a diaphragm which is formed of a metallic glass and has a tensile stress in a range in which a resonant frequency is higher than an audible range; and a counter electrode which is insulated from the diaphragm and has a plurality of holes. The diaphragm and the counter electrode are disposed on the silicon substrate to face each other with a gap therebetween, the diaphragm and the counter electrode being released from the silicon substrate by the cavity.

12 Claims, 10 Drawing Sheets

(51) Int. Cl.
  *G01L 23/12* (2006.01)
  *H01L 41/113* (2006.01)
  *H04R 7/04* (2006.01)
  *H04R 19/00* (2006.01)
  *H04R 19/04* (2006.01)
  *H04R 31/00* (2006.01)
  *G01L 9/00* (2006.01)

(52) U.S. Cl.
  CPC ...... *H01L 41/1132* (2013.01); *H01L 41/1136* (2013.01); *H04R 7/04* (2013.01); *H04R 19/00* (2013.01); *H04R 19/005* (2013.01); *H04R 19/04* (2013.01); *H04R 31/00* (2013.01); *H04R 31/003* (2013.01); *B81B 2201/0257* (2013.01); *B81B 2201/0264* (2013.01); *H04R 2201/003* (2013.01)

(58) Field of Classification Search
  CPC ........ H04R 7/04; H04R 19/005; H04R 19/04; H04R 31/003; B81C 1/0015; H01L 41/1132; H01L 41/1136; B81B 3/0072
  See application file for complete search history.

(56) References Cited

U.S. PATENT DOCUMENTS

| | | | |
|---|---|---|---|
| 9,055,372 | B2 | 6/2015 | Grosh et al. |
| 2008/0232615 | A1* | 9/2008 | Song ............... H04R 31/00 381/174 |
| 2010/0254547 | A1 | 10/2010 | Grosh et al. |
| 2012/0328132 | A1* | 12/2012 | Wang ............... H04R 19/04 381/174 |
| 2014/0197502 | A1 | 7/2014 | Dehe |
| 2015/0021722 | A1 | 1/2015 | Dehe et al. |
| 2016/0304337 | A1* | 10/2016 | Miao ............... H04R 31/003 |

FOREIGN PATENT DOCUMENTS

| | | |
|---|---|---|
| JP | 2008-155333 A | 7/2008 |
| JP | 4770605 B2 | 9/2011 |

OTHER PUBLICATIONS

Murakami et al., "The improvement of mechanical strength for MEMS microphone by applying ventilation structure", 28pm1-B-3, (2015). (with English abstract).

Feiertag et al., "Flip chip packaging for MEMS microphones", Microsystem Technologies, 16 (2010) pp. 817-823.

Dehé, "Silicon microphone development and application", Sensors and Actuators A, 133 (2007) pp. 283-287.

Neumann Jr. et al., "CMOS-MEMS membrane for audio-frequency acoustic actuation", Sensors and Actuators A, 95 (2002) pp. 175-182.

Brauer et al., "Silicon microphone based on surface and bulk micromachining", Journal of Micromechanics and Microengineering, 11 (2001) pp. 319-322.

Horowitz et al., "Development of a micromachined piezoelectric microphone for aeroacoustics applications", Journal of the Acoustical Society of America, 122 (2007) pp. 3428-3436.

Schellin et al., "A silicon subminiature microphone based on piezoresistive polysilicon strain gauges", Sensors and Actuators A, 32 (1992) pp. 555-559.

Sharpe Jr. et al., "Tensile Testing of Polysilicon", Experimental Mechanics, 39 (1999) pp. 162-170.

Wang, "The elastic properties, elastic models and elastic perspectives of metallic glasses", Progress in Materials Science, 57 (2012) pp. 487-656.

International Search Report dated May 30, 2017, issued in corresponding International Patent Application No. PCT/JP2017/012492.

* cited by examiner

FIG. 3A
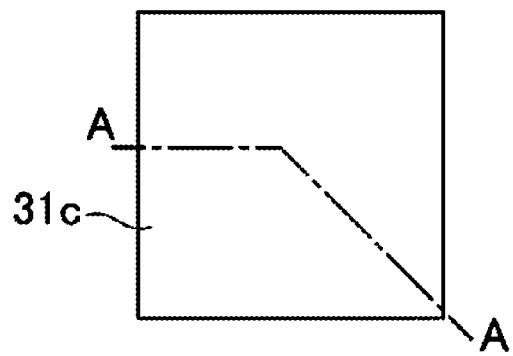
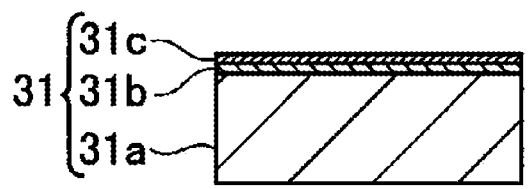
FIG. 3B
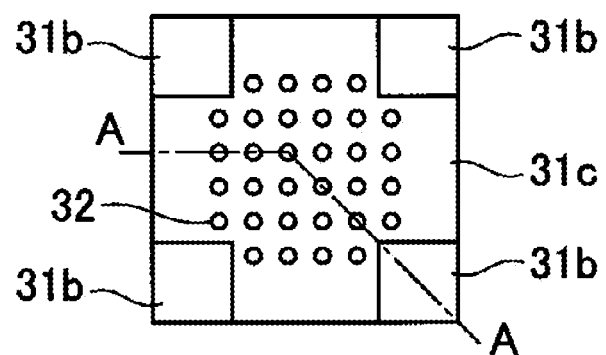
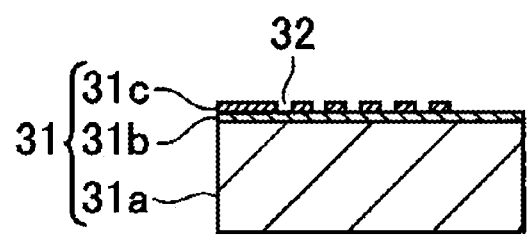

FIG. 3C
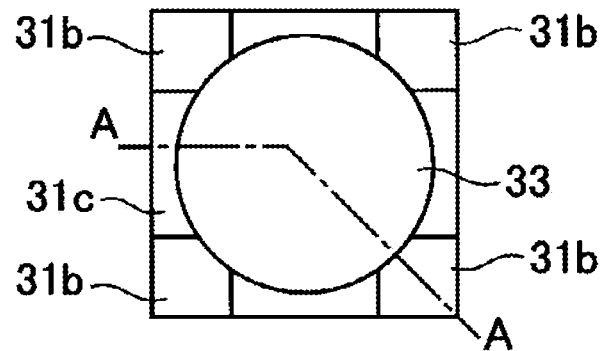
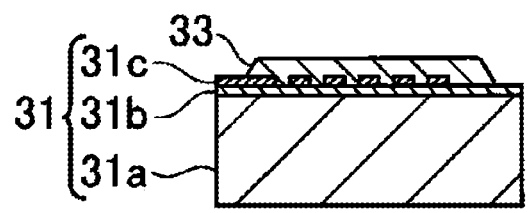
FIG. 3D
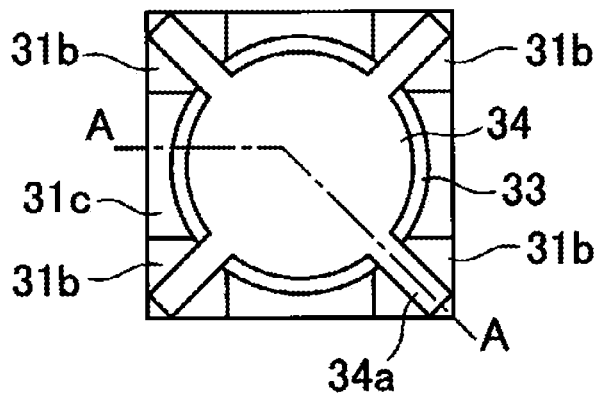
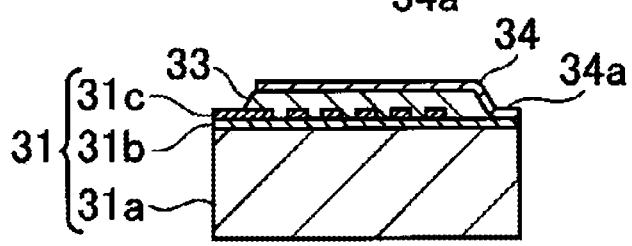

PRESSURE SENSOR AND METHOD OF PRODUCING THE SAME

FIELD OF THE INVENTION

The present invention relates to a high-performance pressure sensor and a method of producing the same.

BACKGROUND ART

A pressure sensor is used as, for example, a microphone which measures the vibration of a diaphragm due to a pressure change of air. Traditionally, an electret condenser microphone (ECM) has been used for miniaturization of microphones and has been used in a wide range from headsets to mobile devices. However, there is a problem in that a temperature for solder mounting is not able to be raised in an ECM due to heat resistance of an electret, and there is a limit to miniaturization and reduction in height thereof. Therefore, particularly in applications in which miniaturization and cost reduction are required, the ECM has been rapidly replaced with a microphone manufactured by micro electro mechanical system (MEMS) technology.

Currently, MEMS microphones are compact, low in cost, excellent in impact resistance and acoustic phase characteristics, and so on, and thus are widely used in mobile phones, smartphones, tablet computers, and so on. In many cases, a plurality of MEMS microphones are mounted for noise canceling. MEMS microphones include electrostatic types, piezoelectric types and piezoresistive types, among which the electrostatic types currently dominate the market. The electrostatic type includes a back chamber, a back plate (a counter electrode) and a sensing diaphragm, a capacitance changes in accordance with a change in a distance between the back plate and the diaphragm, and the change in capacitance is converted into a change in a current, a voltage or a frequency by a readout circuit. A plurality of holes (perforation holes) through which air passes are provided in the back plate.

As a performance index of the microphone, there are a sensitivity, a signal/noise ratio (SNR), a maximum sound pressure level, a dynamic range, a directivity, frequency characteristics, a power consumption, and so on, among which the SNR is an indicator showing to what extent small sounds can be distinguished. At present, the SNR of a MEMS microphone is about 65 dB, but in the future, when applications such as voice recognition expand, MEMS microphones having a higher SNR will be required.

Electrostatic MEMS microphones have several types of structure and configuration. Most typically, the diaphragm and back plate are formed of polysilicon. Supporting methods of the diaphragm include a method in which one place thereon is supported (Patent Document 1, and Non-Patent Document 1), a method in which four corners thereof are supported (Non-Patent Document 2), and a method in which the entire circumference thereof are supported. In these MEMS microphones, a diaphragm displacement readout circuit (ASIC) is formed in a separate die and is connected to a MEMS die having the diaphragm by wire bonding (Non-Patent Documents 1, 3, and 4). That is, in a package of the microphone, two dies including a MEMS die and an ASIC die are mounted. On the other hand, in order to improve the SNR, it is preferable that the diaphragm/back plate capacitor be as close as possible to the readout circuit, and thus there is also an integrated MEMS microphone in which all necessary circuits including a diaphragm and a readout circuit are formed on the same die (Patent Document 2, and Non-Patent Document 5). In such a microphone, only one die is mounted in the package. However, after a formation of a readout circuit, a MEMS structure including a diaphragm has to be formed at a low temperature that does not damage the readout circuit. Therefore, an integrated MEMS microphone from Akustica Inc. in Germany instead of polysilicon which is formed on a diaphragm at a high temperature, employs an organic-inorganic hybrid structure which can be formed at a low temperature (Non-Patent Document 6). From the viewpoint of mechanical properties of the diaphragm, this material is undesirable when compared to polysilicon. Alternatively, another method is to form the circuit to withstand a film formation temperature of polysilicon (Non-Patent Document 7). Although such a method of producing an integrated MEMS has been widely applied to inertial sensors in the past, the method has been eliminated due to performance and cost because it requires to use a special circuit.

In order to improve the SNR of a MEMS microphone, it is necessary to either increase the sensitivity or reduce the noise generated by the device. The noise includes electrical noise and mechanical noise. In the above-described integrated MEMS microphone, the former is lowered by integrating the MEMS structure and the readout circuit. A fluid noise generated by an air flow being throttled in the hole (the perforation hole) formed in the back plate accounts for most of the latter. Therefore, to reduce the mechanical noise, it is desirable to employ a structure which does not require the back plate. Known structures devoid of the back plate include a structure in which reading of the capacitance is performed by a comb-shaped electrode provided around the diaphragm (Patent Documents 3 and 4), and a structure in which a piezoelectric type (Patent Documents 5 and 6, and Non-Patent Document 8) or a piezoresistive type (Non-Patent Document 9) is used.

CITATION LIST

Patent Documents

[Patent Document 1]
U.S. Pat. No. 5,870,482
[Patent Document 2]
U.S. Pat. No. 7,863,714 B2
[Patent Document 3]
US Patent Application, Publication No. 2014/0197502 A1
[Patent Document 4]
US Patent Application, Publication No. 2015/0021722 A1
[Patent Document 5]
US Patent Application, Publication No. 2010/0254547 A1
[Patent Document 6]
U.S. Pat. No. 9,055,372 B2

Non-Patent Documents

[Non-Patent Document 1]
Peter V. Loeppert and Sung B. Lee, "SiSonic™—THE FIRST COMMERCIALIZED MEMS MICROPHONE", Solid-State Sensors, Actuators, and Microsystems Workshop, Hilton Head Island, S.C., Jun. 4-8, 2006, pp. 27-30
[Non-Patent Document 2]
MURAKAMI Ayumu, INOUE Tadashi, KASAI Takashi, "Improvement of mechanical strength of MEMS microphones using a ventilation structure", 32nd "Sensor/Micro-machine and Application System" Symposium, (2015) 28pm1-B-3

[Non-Patent Document 3]
Gregor Feiertag, Matthias Winter, Anton Leidl, "Flip chip packaging for MEMS microphones", Microsystem Technologies, 16 (2010) pp. 817-823

[Non-Patent Document 4]
Alfons Dehe, "Silicon microphone development and application", Sensors and Actuators A, 133 (2007) pp. 283-287

[Non-Patent Document 5]
John J. Neumann Jr., Kaigham J. Gabriel, "CMOS-MEMS membrane for audio-frequency acoustic actuation", Sensors and Actuators A, 95 (2002) pp. 175-182

[Non-Patent Document 6]
M. Brauer, A. Dehe, T. Bever, S. Barzen, S. Schmitt, M. Fuldner and R. Aigner, "Silicon microphone based on surface and bulk micromachining", Journal of Micromechanics and Microengineering, 11 (2001) pp. 319-322

[Non-Patent Document 7]
Stephan Horowitz, Toshikazu Nishida, Louis Cattafesta and Mark Sheplak, "Development of a micromachined piezoelectric microphone for aeroacoustics applications", Journal of the Acoustical Society of America, 122 (2007) pp. 3428-3436

[Non-Patent Document 8]
R. Schellin and G. Hess, "A silicon subminiature microphone based on piezoresistive polysilicon strain gauges", Sensors and Actuators A, 32 (1992) pp. 555-559

[Non-Patent Document 9]
Sharpe Jr. N., Turner, K. T., Edwards, R. L., "Tensile testing of polysilicon", Experimental Mechanics, 39 (1999) pp. 162-170

[Non-Patent Document 10]
Wei Hua Wang, "The elastic properties, elastic models and elastic perspectives of metallic glasses", Progress in Materials Science, 57 (2012) pp. 487-656

SUMMARY

Technical Problem

The structure devoid of the back plate as disclosed in Patent Documents 3 and 4 and Non-Patent Documents 7 and 8 can lower the fluid noise, but also reduce the sensitivity, and thus the SNR is not necessarily improved. The diaphragm may be thinned or larger to increase the sensitivity. However, this may cause a problem of reduced reliability in that the diaphragm is easily broken by application of a large pressure. An increase in a size of the diaphragm leads to an increase in a size of the die and results in an increase in cost. Further, a resonant frequency of the diaphragm lowers to an audible range accordingly, and frequency characteristics when it is used as a microphone may deteriorate.

As described above, although improvement of the SNR of the MEMS microphone is required to advance and allow spread of voice recognition, there is no known microphone which can realize this without disadvantages such as reduced reliability, large size, or increased cost. Such a problem in a microphone is also true with a pressure sensor such as an atmospheric pressure sensor and an ultrasonic sensor.

Accordingly, it is an object of the present invention to provide a pressure sensor having high-performance characteristics and a method of producing the same.

Solution to Problem

The inventors focused on metallic glasses which were researched and developed by researchers of Tohoku University, and have recently become widespread, and completed the present invention with a conception that these materials may be suitable for a diaphragm of a pressure sensor.

A metallic glass material vitrifies even at a relatively slow cooling rate as compared with a conventional amorphous metal, despite including a single metallic element or a metallic element as a main component. Both metallic glasses and amorphous metals are the same in that they both have a disordered structure at the atomic scale, but metallic glasses are different from amorphous alloys in that metallic glasses exhibit a glass transition from a supercooled liquid to a glass (a solid).

The present invention includes the following concept.

[1] A pressure sensor includes: a silicon substrate having a cavity; a diaphragm which is formed of a metallic glass and has a tensile stress in a range in which a resonant frequency is higher than an audible range; and a counter electrode insulated from the diaphragm and having a plurality of holes, in which the diaphragm and the counter electrode are disposed on the silicon substrate to face each other with a gap therebetween, the diaphragm and the counter electrode being released from the silicon substrate by the cavity.

[2] In the pressure sensor described in [1], the diaphragm may be divided into a plurality of portions, and each portion may be supported in a cantilevered manner.

[3] In the pressure sensor described in [1] or [2], a thickness of the diaphragm may vary according to a location.

[4] In the pressure sensor described in [3], the diaphragm may have a thick portion and thin portions surrounding the thick portion, the thick portion forming a honeycomb shape, a lattice shape, a radial shape, or a combination thereof.

[5] The pressure sensor described in any one of [1] to [4] may further include a readout circuit which reads out a vibration signal of the diaphragm may be provided, and the readout circuit and the diaphragm may be provided on the same die.

[6] In the pressure sensor described in any one of [1] to [5], the diaphragm may have a tensile stress greater than 0 and no greater than 500 MPa.

[7] In the pressure sensor described in any one of [1] to [6], 2 to 16 of the diaphragms may be provided on the same die.

[8] In the pressure sensor described in any one of [1] to [7], the metallic glass may be one of a Zr-based metallic glass, a Pd-based metallic glass, a Pt-based metallic glass, an Au-based metallic glass, an Fe-based metallic glass, an Ni-based metallic glass, an Mg-based metallic glass, a Co-based metal glass, and a Cu-based metallic glass.

[9] In the pressure sensor described in any one of [1] to [8], the metallic glass may include one of Zr, Co, and CuZr as a main component.

[10] A method of producing a pressure sensor described in any one of [1] to [9] includes: providing a plurality of holes in a layer to be the counter electrode; providing a sacrificial layer so as to fill the holes and be arranged on the layer to be the counter electrode; providing a metallic glass in the form of a layer on a part of the layer to be the counter electrode and the sacrificial layer; releasing the counter electrode, the sacrificial layer, and the metallic glass layer from the substrate by etching a back surface of the substrate; and removing the sacrificial layer.

[11] In method described in [10], the metallic glass may be provided using a sputtering method.

[12] In method described in [10] or [11], the sacrificial layer may be formed of a resin.

Advantageous Effects

According to the present invention, since the pressure sensor has a diaphragm formed of a metallic glass and having a tensile stress in a range in which the resonant frequency is higher than the audible range, a displacement due to a pressure will be larger than that of existing Si diaphragms with the same dimensions, and thus the pressure can be converted to an electrical signal with high sensitivity. This is because the Young's modulus of the metallic glass is about one third of that of Si. Further, while Si is a brittle material, a metallic glass is a ductile material. In addition, the tensile strength of a metallic glass is equal to or higher than that of Si, and thus a diaphragm formed of a metallic glass is harder to break than Si and is reliable.

Further, according to the present invention, a metallic glass can form a film by low-temperature sputtering, and thus integration of the diaphragm and readout circuit will become easier. The above-described integrated MEMS microphone manufactured by Akustica Inc. in Germany employs an organic-inorganic hybrid material which does not necessarily have excellent mechanical characteristics is used as a material of the diaphragm in order to form a MEMS structure including a diaphragm on the same wafer where the readout circuit has been formed. On the other hand, according to the present invention, it is possible to obtain an integrated MEMS pressure sensor with a diaphragm formed of a metallic glass which has excellent mechanical characteristics, and thus it is possible to improve the SNR.

Further, according to the present invention, when the pressure sensor is used as a microphone and designed such that the resonant frequency of the diaphragm is higher than an audible range with maintaining the pressure resistance of the diaphragm, a diameter of the diaphragm can be greatly reduced without compromising the SNR and the die can be reduced in size due to the above-described material characteristics of the metallic glass. When the diaphragm becomes smaller, the electrostatic capacitance decreases, but a parasitic capacitance can be lowered by forming the readout circuit on the same die.

According to the above-described design, since the diaphragm is greatly downsized, it is possible to mount a plurality of diaphragms on the same die, and it is possible to improve the SNR using a die of the same size. Further, when the pressure sensor according to the present invention is used as an ultrasonic sensor, a phased array can be constituted with a plurality of diaphragms.

As described above, according to the present invention, it is possible to provide a microphone having high-performance characteristics and a method of producing the same.

BRIEF DESCRIPTION OF DRAWINGS

FIG. 3A shows Step 1 relating to a method of producing a microphone according to an embodiment of the present invention, wherein an upper view shows a plan view and a lower view shows a cross-sectional view.

FIG. 3B shows Step 2 relating to the method of producing the microphone according to the embodiment of the present invention, wherein an upper view shows a plan view and a lower view shows a cross-sectional view.

FIG. 3C shows Step 3 relating to the method of producing the microphone according to the embodiment of the present invention, wherein an upper view shows a plan view and a lower view shows a cross-sectional view.

FIG. 3D shows Step 4 relating to the method of producing the microphone according to the embodiment of the present invention, wherein an upper view shows a plan view and a lower view shows a cross-sectional view.

DESCRIPTION OF EMBODIMENTS

Embodiments of the present invention will be described with reference to the drawings on the assumption that a pressure sensor is a microphone. The illustrated embodiments are one of the best modes for carrying out the present invention and modifications thereof are also within the scope of the present invention. The present invention can be applied not only to a case in which the pressure sensor is a microphone but also to a case in which the pressure sensor is an air pressure sensor or an ultrasonic sensor.

[Basic Structure and Producing Method Thereof]

Figure 1:
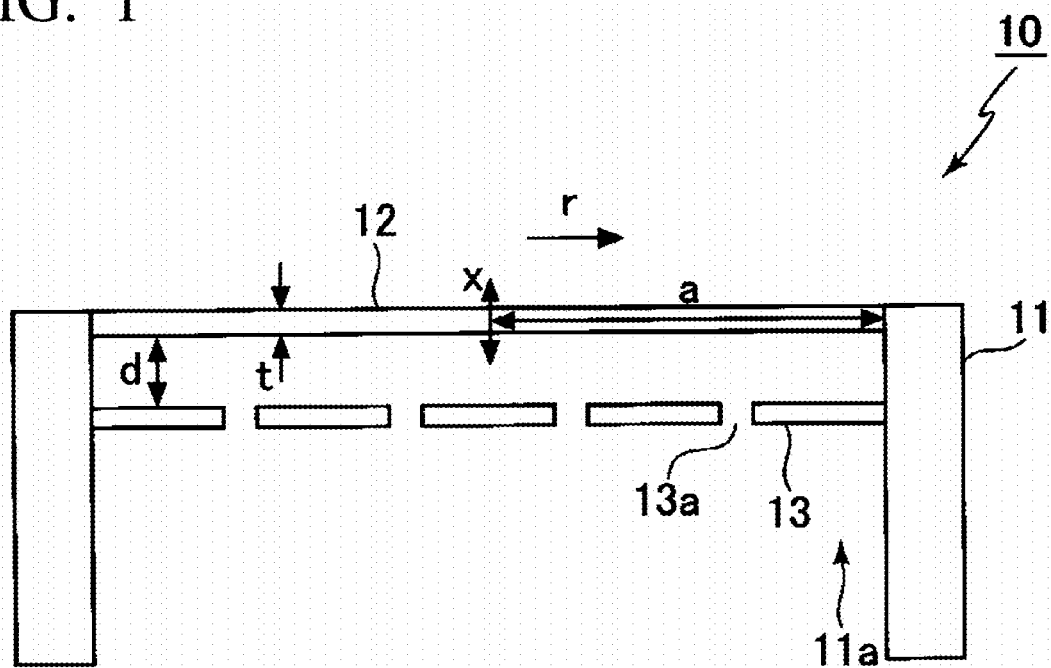
FIG. 1 is a view showing a configuration of a microphone as a pressure sensor according to an embodiment of the present invention.

FIG. 1 is a view showing a configuration of a microphone as a pressure sensor according to an embodiment of the present invention. As shown in FIG. 1, the microphone 10 according to the embodiment of the present invention includes a cylindrical support frame 11, a diaphragm 12 formed of a metallic glass, and a counter electrode 13. The support frame 11 has a cavity 11a, and the counter electrode 13 has a plurality of perforation holes 13a. In the embodiment shown in FIG. 1, the diaphragm 12 and the counter electrode 13 face each other, and a displacement of the diaphragm 12 due to a sound pressure is measured as a capacitance and converted into a voltage by a readout circuit (not shown).

In the embodiment of the present invention, the diaphragm 12 is formed of a metallic glass film. Here, the reason the sensitivity is improved by forming the diaphragm of a metallic glass will be explained on the basis of material mechanics.

A capacitance C formed by the diaphragm 12 having an area A and the counter electrode 13 with a gap d therebetween is expressed by Equation 1, wherein $\varepsilon_0$ is a dielectric constant of air. Here, when a DC voltage $V_{DC}$ is applied between the diaphragm 12 and the counter electrode 13, the gap d is reduced by $x_{DC}$ due to an electrostatic force, and a capacitance Co at that time is expressed by Equation 2. An electric charge $Q_{DC}$ accumulated at that time is expressed by Equation 3.

[Math. 1]

$$C = \frac{A}{d}\varepsilon_0 \quad \text{(Equation 1)}$$

[Math. 2]

$$C_0 = \frac{A}{d - x_{DC}}\varepsilon_0 \quad \text{(Equation 2)}$$

[Math. 3]

$$Q_{DC} = C_0 V_{DC} \quad \text{(Equation 3)}$$

When the sound pressure reaches the diaphragm 12 and thus the diaphragm 12 vibrates with a displacement of $x_{AC}$, the displacement x of the diaphragm 12 is expressed by Equation 4, and a voltage $V_{AC}$ generated at that time is expressed by Equation 5. Assuming that an output current of the microphone 10 is an impedance $Z_1$, it is indicated by a current $I_{AC}$ of Equation 6.

[Math. 4]

$$x = d - x_{DC} + x_{AC} = d_0 + x_{AC} \quad \text{(Equation 4)}$$

[Math. 5]

$$V_{AC} = \frac{d_0}{\varepsilon_0 A}Q_{DC} + \frac{x_{AC}}{\varepsilon_0 A}Q_{DC} \quad \text{(Equation 4)}$$

[Math. 6]

$$I_{AC} = \frac{V_{AC}}{Z_I} \quad \text{(Equation 6)}$$

On the other hand, a deformation when a pressure P is applied to the diaphragm 12 can be estimated by an equation of material mechanics. A displacement x(r) at a position away from a center at a distance r is expressed by Equation 7, wherein a and t are a radius and a thickness of the diaphragm 12, respectively. Here, D is a flexural rigidity of the diaphragm 12 and is expressed by Equation 8. E is the Young's modulus of a material of the diaphragm 12, and ν is a Poisson's ratio of the material of the diaphragm 12. An average displacement x can be found by Equation 9:

[Math. 7]

$$x(r) = \frac{Pa^4}{64D}\left(1 - \frac{r^2}{a^2}\right) = x_p\left(1 - \frac{r^2}{a^2}\right)^2 \quad \text{(Equation 7)}$$

[Math. 8]

$$D = \frac{Et^3}{12(1 - \nu^2)} \quad \text{(Equation 8)}$$

[Math. 9]

$$x = \frac{\int_0^a 2\pi r x(r) dr}{\pi a^2} = P\frac{a^4}{192D} = \frac{x_p}{3} \quad \text{(Equation 9)}$$

$x_p$ is a displacement (the maximum displacement) at the center (r=0) of the diaphragm 12.

Hence, a relationship shown in Equation 10 can be obtained from Equation 6 and Equation 9.

[Math. 10]

$$I_{AC} \sim x \sim \frac{1}{D} \sim \frac{(1 - \nu^2)}{E} \quad \text{(Equation 10)}$$

From this equation, it can be seen that, when dimensions are the same, the output current is roughly inversely proportional to the Young's modulus E of the material of the diaphragm 12. That is, the sensitivity is roughly inversely proportional to the Young's modulus E of the material of the diaphragm 12.

Table 1 shows a relative sensitivity of the microphones, one of which employs polysilicon as the material of the diaphragm 12, and the other of which employ PdSiCu and ZrCuAlNi which are metallic glass. Data on polysilicon (*) is cited from Non-Patent Document 9. Data on the metallic glasses (**) is cited from Non-Patent Document 10.

TABLE 1

|  | Polysilicon | PdSiCu metallic glass | ZrCuAlNi metallic glass |
|---|---|---|---|
| Young's modulus E [GPa] | 162 ± 14 * | 80 | 80.5 ** |
| Poisson's ratio ν | 0.22 ± 0.01 * | 0.411 ** | 0.375 ** |
| $\frac{(1 - \nu^2)}{E}$ [Pa$^{-1}$] | ~5.9 × 10$^{-12}$ | ~10.4 × 10$^{-12}$ | ~10.7 × 10$^{-12}$ |

From Table 1, it can be seen that relative sensitivity ((1−ν²)/E) roughly doubles when replacing polysilicon with a metallic glass.

Since the diaphragm 12 needs to withstand an excessive pressure or impact, a mechanical strength of the diaphragm 12 is also important. Table 2 shows tensile strengths of polysilicon, and PdSiCu and ZrCuAlNi as a metallic glass. Data on polysilicon (*) is cited from Non-Patent Document 9. Data on the metallic glasses (**) is cited from Non-Patent Document 10.

TABLE 2

|  | Polysilicon | PdSiCu metallic glass | ZrCuAlNi metallic glass |
|---|---|---|---|
| Tensile strength [GPa] | 1.45 ± 0.19 * | 1.1 | 1.8 ** |

A metallic glass has a tensile strength equal to or higher than that of polysilicon. More importantly, a metallic glass is a ductile material and is less likely to break down due to an impact or stress concentration as compared with polysilicon, which is a brittle material. Therefore, it can be conceived that the diaphragm 12 will be able to be made thin while maintaining reliability by changing the material of the diaphragm 12 from polysilicon to a metallic glass. In other words, with the same diaphragm thickness, the reliability will be increased.

Next, frequency characteristics of the diaphragm 12 will be discussed. A first-bending resonant angular frequency $\omega_0$ of the diaphragm 12 is given by Equation 11, $k_1$ being an equivalent spring constant of the diaphragm 12, m being an equivalent mass, and $\rho$ being a density:

[Math. 11]

$$\omega_0 = \sqrt{\frac{k_1}{m}} - \frac{10.22}{\left(a^2\sqrt{\frac{\rho t}{D}}\right)} \quad \text{(Equation 11)}$$

wherein

[Math. 12]

$$k_1 = \frac{192\pi D}{a^2} \quad \text{(Equation 12)}$$

Accordingly, when dimensions are the same, a ratio of a resonant frequency of the diaphragm formed of polysilicon to that of the diaphragm formed of a metallic glass is expressed by Equation 13.

[Math. 13]

$$\frac{\omega_{0\,polySi}}{\omega_{0\,TMG}} = \sqrt{\frac{\frac{\rho_{TMG}}{D_{TMG}}}{\frac{\rho_{polySi}}{D_{polySi}}}} = \sqrt{\frac{\frac{\rho_{TME}(1-v^2_{TMG})}{E_{TMG}}}{\frac{\rho_{polySi}(1-v^2_{polySi})}{E_{polySi}}}} \quad \text{(Equation 13)}$$

Table 3 shows the density, the relative sensitivity ($(1-v^2)/E$), and the resonant frequency ratio for polysilicon, and PdSiCu and ZrCuAlNi as a metallic glass. Data on the metallic glasses (**) is cited from Non-Patent Document 10.

TABLE 3

|  | Polysilicon | PdSiCu metallic glass | ZrCuAlNi metallic glass |
|---|---|---|---|
| Density [kg/m³] | 2.3 × 10³ | 10.4 × 10³ ** | 6.67 × 10³ ** |
| $\frac{(1-v^2)}{E}$ | ~5.9 × 10⁻¹²/Pa | ~10.4 × 10⁻¹²/Pa | ~10.7 × 10⁻¹²/Pa |
| $\frac{\omega_{0polySi}}{\omega_{0TMG}}$ | 1 | 2.8 | 2.3 |

In Table 3, the sensitivity of a metallic glass as the pressure sensor is approximately double as compared with that of polysilicon, but the resonant frequency falls in a range of ½ to ⅓, when each diaphragm is produced with the same dimensions. When the pressure sensor is used as a microphone, there is a possibility that the resonant frequency may come within a sound frequency range, which may cause a problem depending on a design. Therefore, when a diaphragm of a microphone is produced using a metallic glass, it is necessary to optimize dimensions depending on material properties. As can be seen from Equations 7, 8 and 11, when a thickness is multiplied by X while maintaining the resonant frequency of the diaphragm, a radius a of the diaphragm becomes √X times, and thus the relative sensitivity becomes 1/X times. From this, it can be seen that the sensitivity can be improved by thinning the diaphragm and making the diaphragm smaller accordingly. However, it is necessary to ensure sufficient pressure resistance even when the diaphragm becomes thinner.

Here, when a specific design is made on the basis of the material mechanics with regard to a diaphragm formed of a $Zr_{53}Ti_5Cu_{20}Ni_{12}Al_{10}$ metallic glass, approximately the same resonant frequency and pressure resistance can be obtained by making the thickness 0.33 times and the diameter 0.39 times as compared with those of the polysilicon diaphragm. It is noted here that the relative sensitivity is almost the same (1.03 times) as compared with that of the polysilicon diaphragm. On the other hand, an area of the diaphragm is approximately 0.15 times, and thus it is possible to greatly reduce a size of the die while maintaining the sensitivity.

In the above-described design, since the diaphragm is greatly reduced in size, a plurality of diaphragms can be mounted on the same die. In addition, diaphragms of M rows×N columns in a matrix can also be disposed on the same die. For example, when diaphragms of 2 rows×4 columns are disposed on the same die, the area of the die is increased only by approximately 20%, whereas the sensitivity improves to more than 8 times. Further, when the pressure sensor according to the present invention is used as an ultrasonic sensor, a phased array can be obtained using a plurality of diaphragms, which allows to measure a distance and an orientation of an object by ultrasonic waves.

Further, according to the present invention, the thickness of the diaphragm may be varied within the diaphragm. For example, a thick portions forming a honeycomb shape, a lattice shape, a radial shape, a concentric circle shape, or combinations thereof may be arranged to improve the sensitivity while the resonant frequency and the mechanical strength are kept high.

Figure 2:
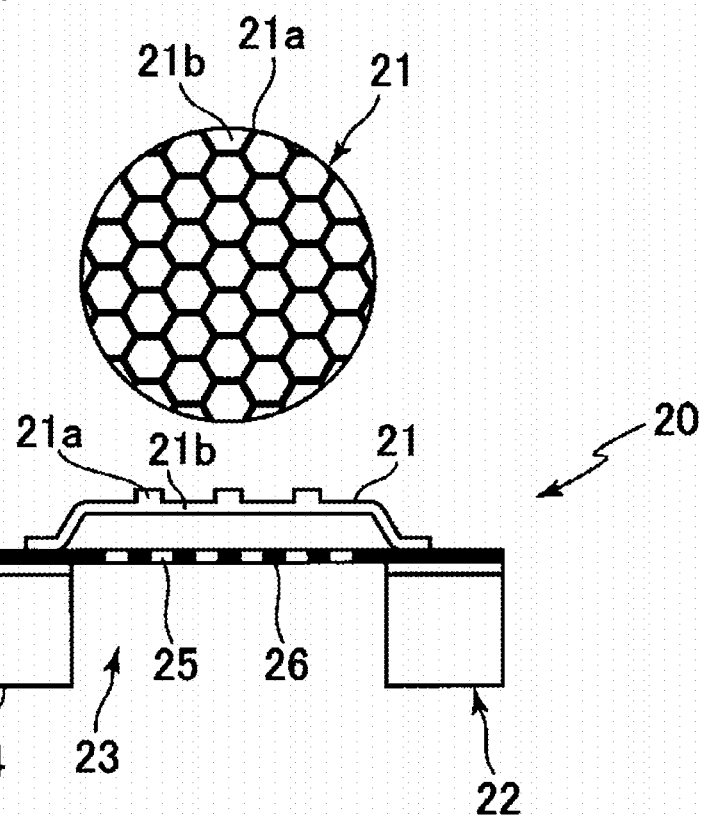
FIG. 2 is a view showing a diaphragm constituting a microphone according to an embodiment of the present invention, wherein an upper view shows a plan view and a lower view shows a cross-sectional view.

FIG. 2 is a view showing a diaphragm 21 constituting a microphone 20 according to an embodiment of the present invention, wherein an upper view shows a plan view and a lower view shows a cross-sectional view. The microphone 20 includes a MEMS die 22, a substrate 24 having a cavity 23, a counter electrode 26 having a plurality of perforation holes 25 on the substrate 24, and a diaphragm 21, in which at least the diaphragm 21 and the counter electrode 26 are insulated from each other. In the diaphragm 21, the thick portion 21a is arranged in the form of a honeycomb and defines thin portions 21b. A ratio of a thickness of the thick portion 21a to a thickness of the thin portions 21b may be 2 to 3 times. The perforation holes 25 and the thick portion 21a may face each other or the thick portion may be formed on the opposite side of the diaphragm 21. Accordingly, even when the diaphragm 21 is formed of the metallic glass, it is possible to ensure durability.

The rigidity of the diaphragm and the resonant frequency associated therewith also change according to a stress of the diaphragm. Therefore, one of parameters which control the characteristics of the diaphragm is the stress. One of the methods for solving the problem of the resonant frequency reduction is to give a tensile stress to the diaphragm such that the resonant frequency of the metallic glass diaphragm is approximately equal to the resonant frequency of the Si diaphragm. The resonant frequency increases by pulling the diaphragm. A tensile stress of 0 to 500 MPa is preferable. There is a concern that the diaphragm may tend to break due to the tensile stress, but within the above-described range of the tensile stress the concern can be solved due to excellent mechanical properties of the metallic glass.

FIGS. 3A to 3G are views showing a method of producing a microphone 30 according to an embodiment of the present invention. In each of FIGS. 3A to 3G, the upper view shows a plan view, and the lower view shows a cross-sectional view along line A-A.

In Step 1, a substrate 31 having a layer (referred to as "counter electrode layer") 31c which serves as a counter electrode is prepared. Specifically, as shown in FIG. 3A, an SOI substrate 31 is prepared, the SOI substrate having an $SiO_2$ layer 31b on an Si substrate 31a and also having an Si semiconductor layer 31c on the $SiO_2$ layer 31b.

In Step 2, a plurality of holes (perforation holes) 32 are provided in the counter electrode layer 31c. Specifically, as shown in FIG. 3B, the plurality of holes (perforation holes) 32 are provided in the Si semiconductor layer 31c on the surface of the SOI substrate 31 by etching. Further, each corner portion of the Si semiconductor layer 31c is etched in a rectangular shape to expose the $SiO_2$ layer 31b.

In Step 3, a sacrificial layer 33 is provided so as to fill the holes 32 and be arranged on the counter electrode layer 31c. Specifically, as shown in FIG. 3C, the sacrificial layer 33 formed of a resin (a photoresist) is provided to fill the holes 32 and be arranged on the Si semiconductor layer 31c. If necessary, the surface of the resin is planarized by reflow.

In Step 4, a metallic glass is provided in the form of a layer on a part of the counter electrode layer 31c and on the sacrificial layer 33. Specifically, as shown in FIG. 3D, a metallic glass layer 34 is provided on a part of the Si semiconductor layer 31c and on the sacrificial layer 33. Here, the metallic glass can be formed in a film shape by sputtering. A part of the metallic glass layer 34 is provided on the $SiO_2$ layer 31b to be a support portion 34a. When it is desired to change the thickness of the diaphragm according to a location, a photoresist is patterned on the existing metallic glass, and a metallic glass is deposited thereon by sputtering and then lifted off.

Next, the counter electrode, the sacrificial layer 33, and the metallic glass layer 34 are released from the substrate 31 by etching the back surface of the substrate 31.

Figure 3E:
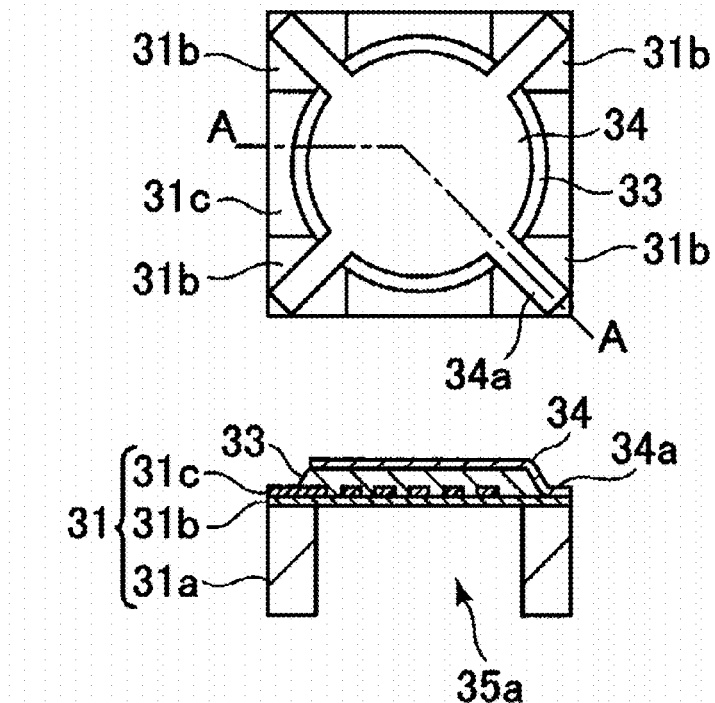
FIG. 3E shows Step 5 relating to the method of producing the microphone according to the embodiment of the present invention, wherein an upper view shows a plan view and a lower view shows a cross-sectional view.

Specifically, in Step 5, as shown in FIG. 3E, a part of the Si substrate 31a on the back side of the SOI substrate 31 is removed by etching to form a part 35a of the cavity.

Figure 3F:
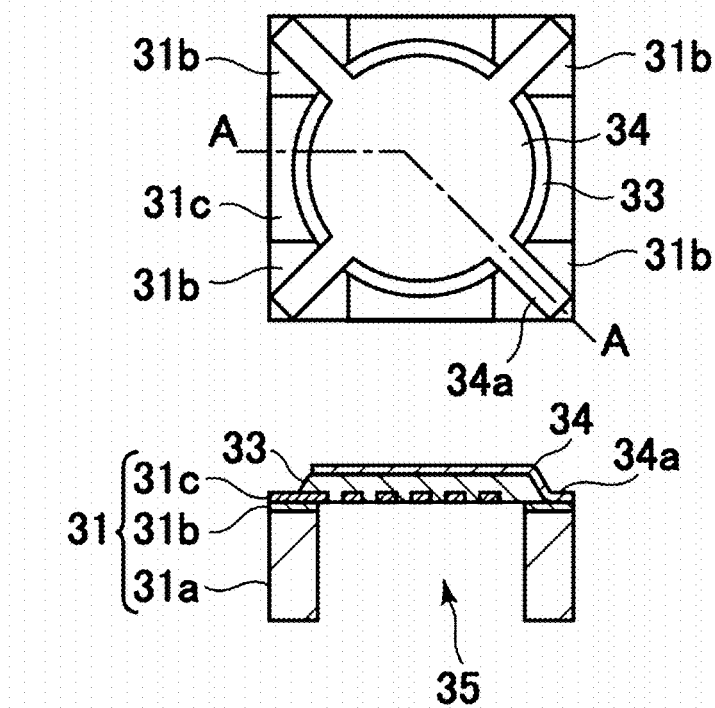
FIG. 3F shows Step 6 relating to the method of producing the microphone according to the embodiment of the present invention, wherein an upper view shows a plan view and a lower view shows a cross-sectional view.

In Step 6, as shown in FIG. 3F, the substrate 31 is removed to the back surface of the Si semiconductor layer 31c to form the cavity 35.

Figure 3G:
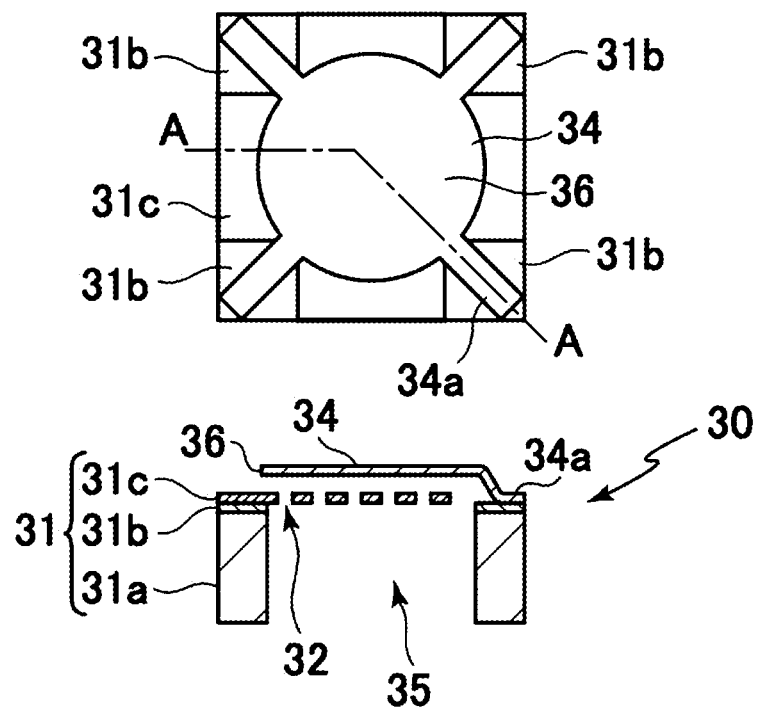
FIG. 3G shows Step 7 relating to the method of producing the microphone according to the embodiment of the present invention, wherein an upper view shows a plan view and a lower view shows a cross-sectional view.

In Step 7, as shown in FIG. 3G, the sacrificial layer 33 is removed by oxygen ashing, etching with an organic solvent, or atomic hydrogen etching to release the diaphragm 36.

Since this series of processes does not use a high-temperature process and uses a low-temperature film-forming process, it is possible to easily integrate a circuit on the microphone.

The above-described example employs PdSiCu or ZrCuAlNi as the metallic glass, but it may be any one of a Zr-based metallic glass, a Pd-based metallic glass, a Pt-based metallic glass, an Au-based metallic glass, an Fe-based metallic glass, an Ni-based metallic glass, an Mg-based metallic glass, a Co-based metal glass, and a Cu-based metallic glass.

Examples of Zr-based metallic glasses include $Zr_{53}Ti_5Cu_{20}Ni_{12}Al_{10}$, $Zr_{55}Cu_{30}Al_{10}Ni_5$, $Zr_{75}Cu_{19}Al_{16}$, and the like.

Examples of Pd-based metallic glasses include $Pd_{40}Ni_{10}Cu_{30}P_{20}$, $Pd_{78}Cu_6Si_{16}$, and the like.

Examples of the Pt-based metallic glasses include $Pt_{58}Cu_{15}Ni_5P_{23}$, and the like.

Examples of the Au-based metallic glasses include $Au_{49}Ag_6Pd_2Cu_{27}Si_{16}$, and the like.

Examples of the Fe-based metallic glasses include $Fe_{76}Si_9B_{10}P_5$, and the like.

Examples of the Ni-based metallic glasses include $Ni_{60}Nb_{15}Ti_{20}Zr_5$, and the like.

Examples of the Mg-based metallic glasses include $Mg_{57}Cu_{34}Nd_9$, $Mg_{64}Ni_{21}Nd_{15}$, and the like.

Examples of the Co-based metallic glasses include $Co_{56}Ta_9B_{35}$, and the like.

Examples of the Cu-based metallic glasses include $Cu_{50}Zr_{50}$, $Cu_{50}Zr_{45}Al_5$, and the like.

These metallic glasses can be formed in a film shape by a sputtering method.

The metallic glass may contain Zr as a main element. This is because not only are the tensile strength high, the density low, and the mechanical properties excellent, but also a raw material can be obtained cheaply as compared with a metallic glass containing Pd, Au, or Pt as a main component and the manufacturing cost is reduced. Also, since it has no magnetism, it will not be affected by magnetic noise. A Co-based metallic glass and a Cu-based metallic glass have high strength (specific strength) with respect to the density, and the former has particularly high strength.

Specific Embodiment

Figure 4:
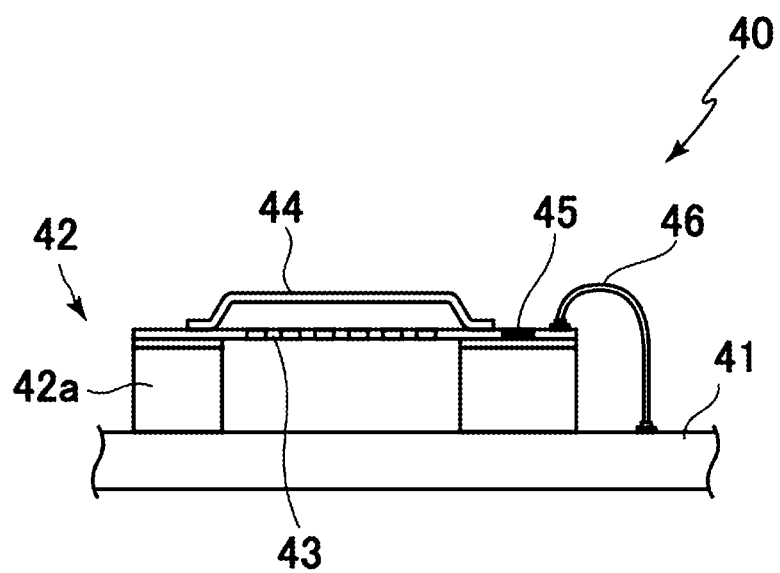
FIG. 4 is a view showing a configuration of a microphone as a pressure sensor according to an embodiment of the present invention.

FIG. 4 is a view showing a configuration of a microphone as a pressure sensor according to an embodiment of the present invention. A microphone 40 as a specific pressure sensor of the present invention is configured by mounting a die 42 on a base 41 of a package. The die 42 includes a substrate 42a, a counter electrode 43, and a diaphragm 44 having a MEMS structure and formed of a metallic glass. The die 42 includes a readout circuit 45. The diaphragm 44 on the die 42 is connected to the readout circuit 45, and the readout circuit 45 is connected to the base 41 by a wiring 46 such as wire bonding.

Accordingly, a sound wave reaches the diaphragm 44, the diaphragm 44 is displaced, and a capacitance change caused by the displacement can be read out by the readout circuit 45.

Figure 5:
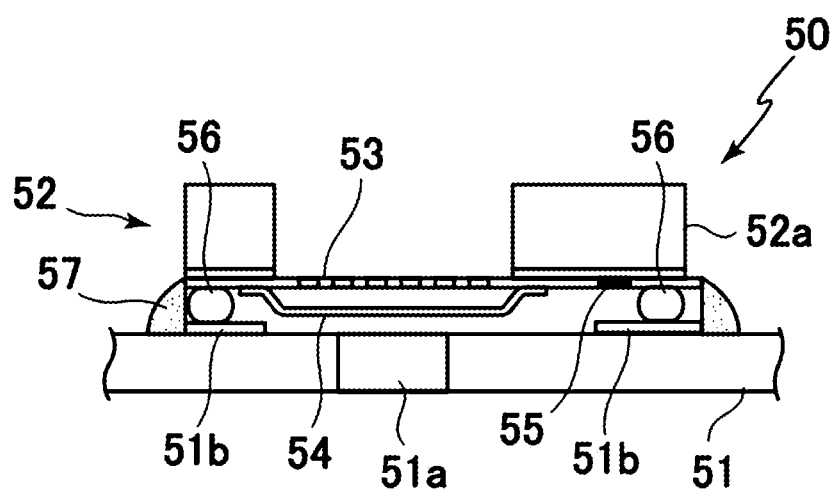
FIG. 5 is a view showing a configuration of a microphone as a pressure sensor different from that in FIG. 4 according to an embodiment of the present invention.

FIG. 5 is a diagram showing a configuration of a microphone as a specific pressure sensor according to an embodiment of the present invention which is different from FIG. 4. The microphone 50 as a pressure sensor is configured by mounting a die 52 on a base 51 of a package. A sound hole 51a is formed in the base 51. The die 52 includes a substrate 52a, a counter electrode 53, and a diagram 54 having a MEMS structure and formed of a metallic glass. The die 52 includes a readout circuit 55. A vibration signal of the diaphragm 54 is output to the readout circuit 55. In FIG. 5, a wiring 51b is formed on the base 51, bumps 56 are mounted on the wiring 51b, and each of the bumps 56 is connected to the diaphragm 54 and the readout circuit 55. If necessary, a gap between the base 51 of the package and the die 52 is sealed with a sealing material 57 such as a resin so that the sound pressure does not leak out.

Hereinafter, the present invention will be described more specifically with reference to examples.

Examples

First, PdCuSi and ZrCuAlNi are selected as new materials for a MEMS microphone. Although it is known conventionally that a metallic glass film can be deposited by a sputtering method, it is not common as a MEMS material, film stress control is not easy, there has been no idea for applying it to a MEMS microphone in which the film stress needs to be precisely controlled between zero stress and an appropriate tensile stress, and thus a possibility thereof has also not been disclosed. The inventors have conducted fundamental studies and found that the metallic glass deposited by a sputtering method can be applied to a MEMS microphone.

A PdCuSi metallic glass was deposited by a sputtering method under the following conditions. In the sputtering, a high-frequency power was set to 100 W, an Ar gas flow rate was set to 10 sccm, a deposition pressure was set to 1.34 Pa, a deposition time was set to 50 minutes, one cycle was 300 seconds, and a cool-down time was 300 seconds. A rotation speed of the substrate was set to 20 rpm. A deposition rate of the PdCuSi metallic glass was 16.6 nm/min. Thereafter, annealing was performed between 350° C. and 410° C. to adjust the film stress such that it was within the above-described range.

Figure 6:
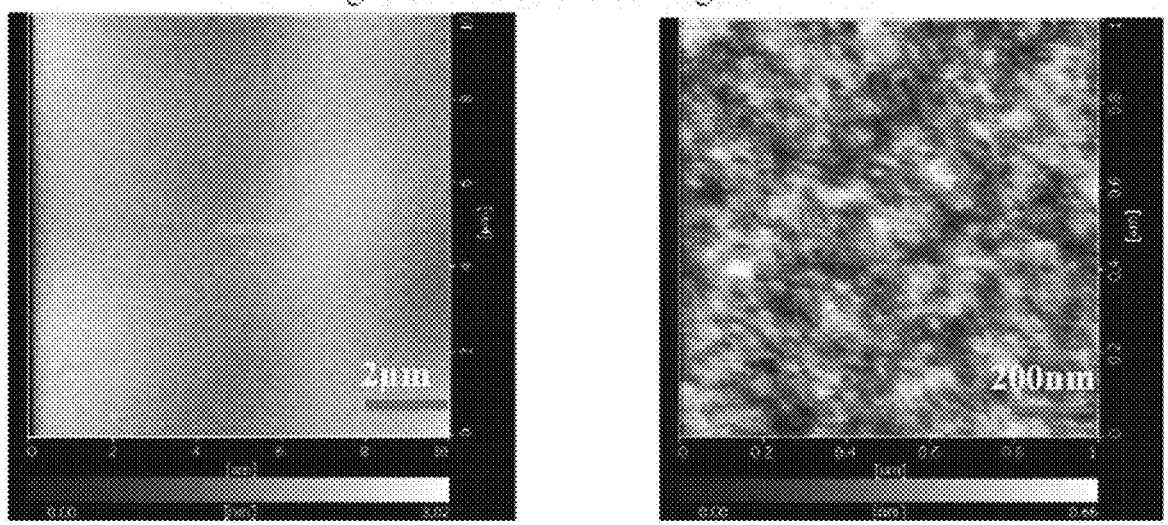
FIG. 6 is an AFM image of a PdCuSi metallic glass according to an example.

FIG. 6 is an AFM image of the PdCuSi metallic glass. From this image, it was found that the surface roughness Ra was about 0.1 nm and a sufficiently smooth metallic glass thin film was formed.

A ZrCuAlNi metallic glass was deposited by a sputtering method under the following conditions. In the sputtering, the high-frequency power was set to 100 W, the Ar gas flow rate was set to 15 sccm, the deposition pressure was set to 0.4 Pa, the deposition time was set to 60 minutes, one cycle was 300 seconds, and the cool-down time was 300 seconds. The substrate was not rotated. The deposition rate of the ZrCuAlNi metallic glass was 11.83 nm/min. Thereafter, annealing was performed between 400° C. and 480° C. to adjust the film stress within the above-described range.

Figure 7:
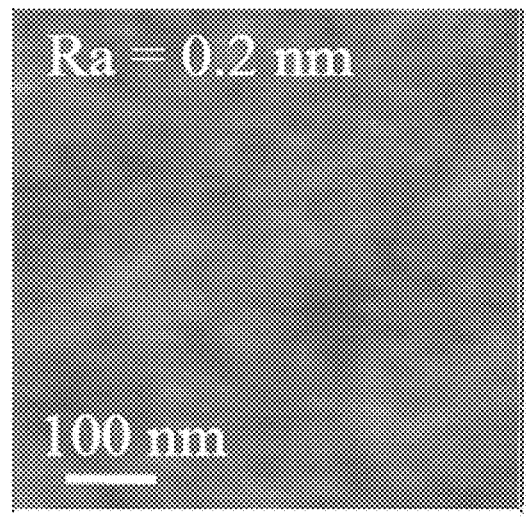
FIG. 7 is an AFM image of a ZrCuAlNi metallic glass according to an example.

FIG. 7 is an AFM image of the ZrCuAlNi metallic glass. From this image, it was found that the surface roughness Ra was about 0.2 nm and a sufficiently smooth metallic glass thin film was formed.

Figure 8:
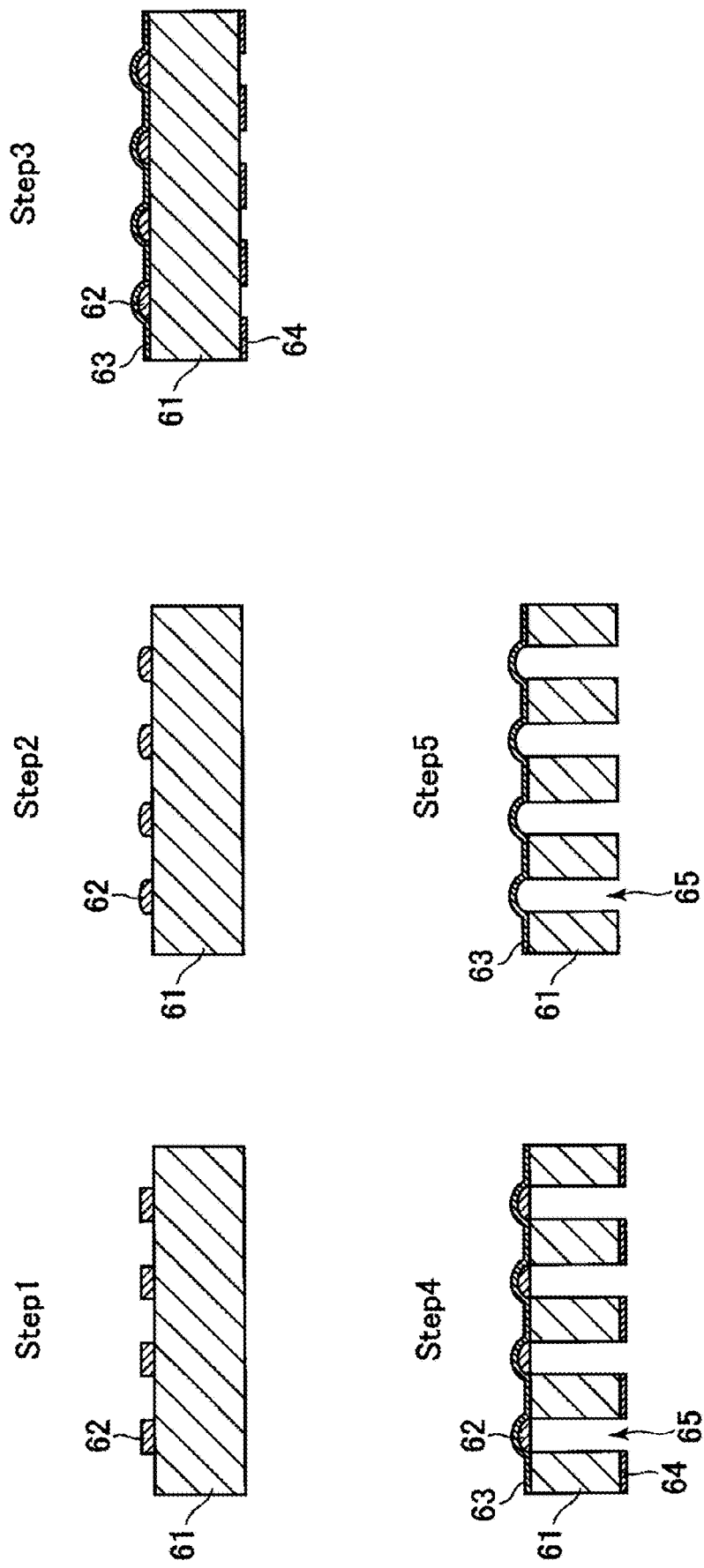
FIG. 8 is a view showing a method of fabricating a diaphragm formed of a metallic glass through Step 1 to Step 5 according to an example.

Next, for testing a MEMS microphone structure, a metallic glass diaphragm was experimentally produced as follows. FIG. 8 is a view showing a method of producing a metallic glass diaphragm as an example.

In Step 1, a photoresist 62 was deposited as a sacrificial layer on the Si substrate 61 and patterned.

In Step 2, the photoresist 62 was reflowed by heating.

In Step 3, a metallic glass film 63 was deposited, and a mask 64 was patterned on the back surface of the substrate. When it is desired to change the thickness of the diaphragm according to a location, a patterned metallic glass film is formed thereon by a lift-off method using a photoresist.

In Step 4, Si of the substrate 61 was etched to form a cavity 65.

In Step 5, the photoresist 62 as the sacrificial layer and the mask 64 were removed by oxygen ashing or acetone.

Figure 9:
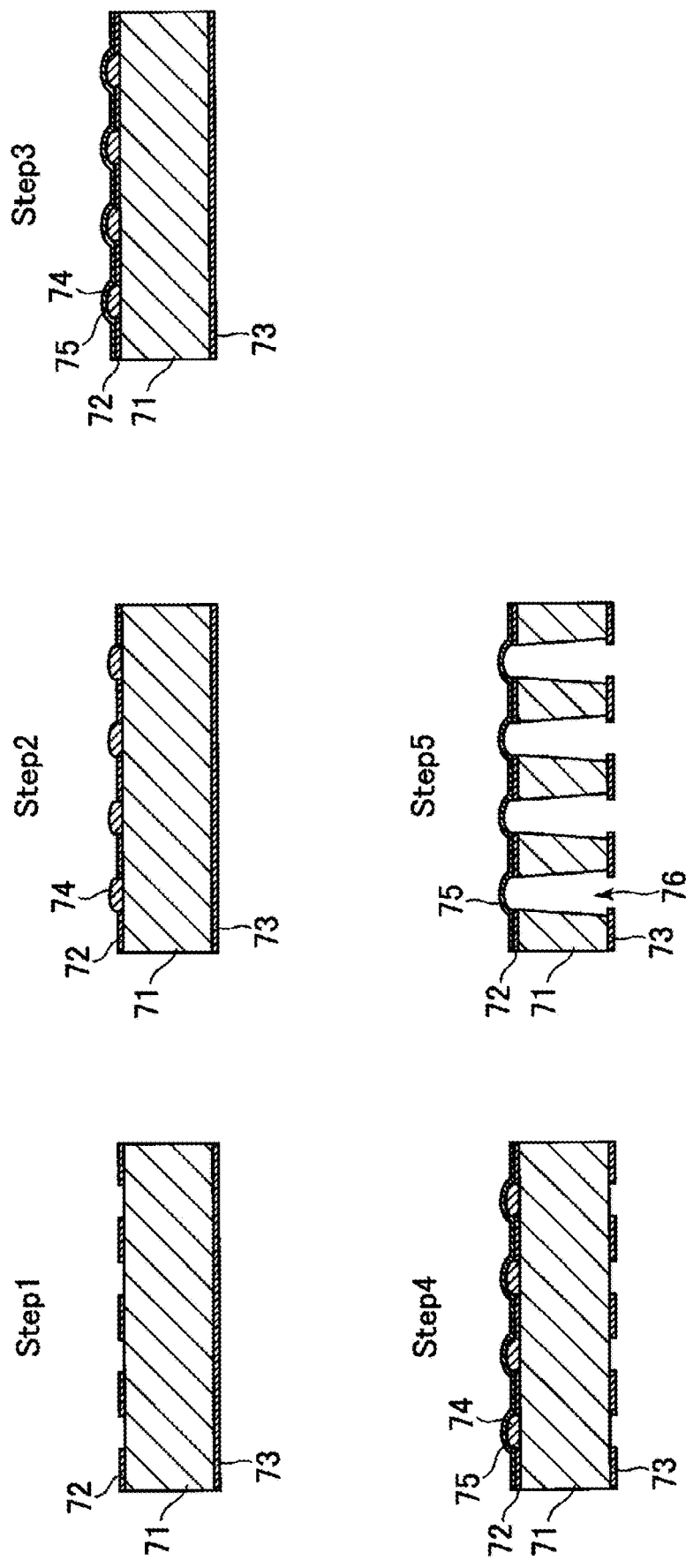
FIG. 9 is a view showing a method of fabricating a diaphragm formed of a metallic glass different from that of FIG. 8 through Step 1 to Step 5 according to an example.

FIG. 9 is a view showing another method of experimentally producing the metallic glass diaphragm as an example.

In Step 1, both surfaces of the Si substrate 71 were oxidized into $SiO_2$ layers 72 and 73, and the $SiO_2$ layer 72 on one surface thereof was patterned.

In Step 2, patterning was performed so that a photoresist 74 was provided in the hole on the side provided with the $SiO_2$ layer 72, and then reflowing was performed.

In Step 3, a metallic glass film 75 was deposited by a sputtering method.

In Step 4, the $SiO_2$ layer 73 on the back side was patterned.

In Step 5, a part of the Si substrate 71 was etched with KOH to form a cavity 76, and the photoresist 74 was removed.

Figure 10:
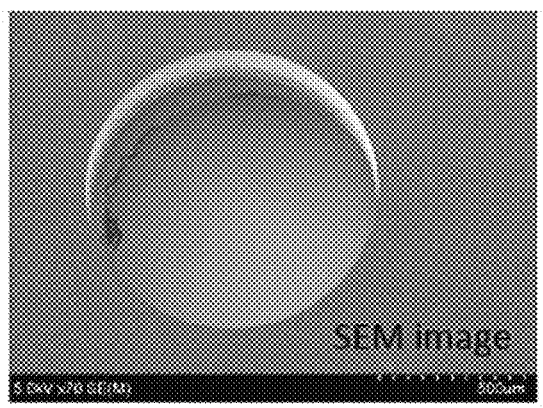
FIG. 10 is an SEM image of a diaphragm fabricated according to the example.

FIG. 10 is an SEM image of the diaphragm produced in the example. It was found that the diaphragm was produced as designed. In addition, it was confirmed that the diaphragm had a high mechanical strength without being damaged even when a pressure flow was applied by an air nozzle.

In the foregoing, embodiments and examples of the present invention have been described by exemplifying a microphone as a pressure sensor. That is, referring to FIG. 1, the microphone 10 as a pressure sensor according to the embodiment of the present invention includes the support frame 11 having the cavity 11a, the diaphragm 12 formed of a metallic glass and having a tensile stress in a range in which the resonant frequency is higher than an audible range, and the counter electrode 13 insulated from the diaphragm 12 and having a plurality of holes, the diaphragm 12 and the counter electrode 13 are provided on the silicon substrate to face each other with a gap therebetween, and the diaphragm 12 and the counter electrode 13 are released from the silicon substrate by the cavity 11a. The support frame 11 is constituted with a silicon-based substrate.

Therefore, according to the embodiments of the present invention, unlike a diaphragm formed as a silicon-based material, when a diaphragm is produced with the same dimensions, the resonant frequency falls in the range from ½ to ⅓. In order to minimize this decrease, a size and a thickness of the diaphragm are set to be smaller than the case in which the diaphragm is formed of a conventional silicon-based film, and the diaphragm is formed to have a tensile stress. Here, the resonant frequency of the diaphragm is in a range of 20 kHz to 60 kHz, particularly preferably in a range of 40 kHz to 50 kHz. This is to suppress the resonant in the audible range and to obtain frequency characteristics which are as flat as possible. Further, in order to deal with this, the size of the diaphragm is in a range of 50 to 80%, particularly preferably 65 to 75%, as compared with that of polysilicon, the thickness is ½ to ⅓ of that of the Si diaphragm, and it is on the order of several hundred nm. This is because the strength and the sensitivity can then be compatible with each other while the resonant frequency is set in a desirable range within this range. The diaphragm has a tensile stress in a range of 0 to 500 MPa, particularly preferably 0 to 100 MPa. This is because the diaphragm is kept flat in this range, the resonant frequency is in a desirable range, and better sensitivity and strength can be secured.

The pressure sensor according to the embodiment of the present invention can be applied not only to a microphone but also to a pressure sensor such as an air pressure sensor or an ultrasonic sensor. Particularly, when a weak pressure is measured by a displacement of the diaphragm, ready deformation and maintaining of the mechanical strength of the diaphragm can be achieved by forming the diaphragm of the metallic glass. The embodiment of the present invention is not limited to the above-described matters and may be as follows, for example.

The illustrated diaphragm may be disposed on the back side of the back plate (the counter electrode), but a positional relationship between the diaphragm and the counter electrode may be reversed in an up-down direction.

The diaphragm may be fixed to a frame body at one or more locations, and a peripheral edge of the diaphragm may be fixed in a circumferential manner.

Figure 11:
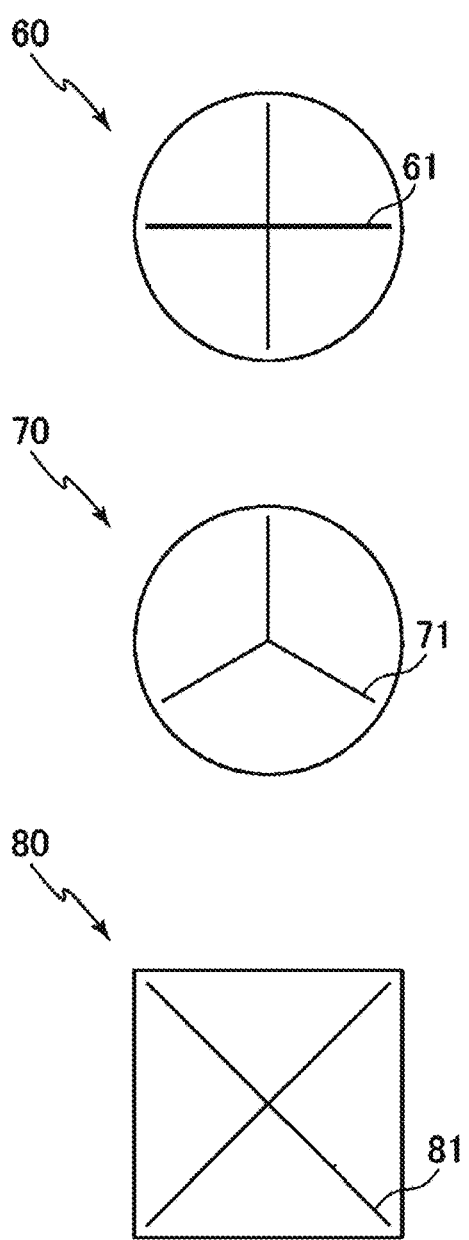
FIG. 11 is a view showing variations of the diaphragm.

The diaphragm may have a uniform thickness, or may partially have a thick portion as shown in FIG. 2. Further, as shown in FIG. 11, slits 61, 71, and 81 may be provided in the diaphragms 60, 70, and 80 to divide the diaphragm into two, three, four, or more portions. In this case, the diaphragm is supported in a cantilevered manner. Further, the diaphragm may have various shapes such as a circular shape, a rectangular shape, or the like in planar view.

REFERENCE SIGNS LIST

10 Microphone
11 Support frame
12 Diaphragm
13 Counter electrode
13a Perforation hole
20 Microphone
21 Diaphragm
22 MEMS die
23 Cavity
24 Substrate
25 Perforation hole
26 Counter electrode
21a Thick portion
21b Thin portion
30 Microphone
31 Substrate (SOI substrate)
31a Substrate
31b SiO$_2$ layer
31c Counter electrode (semiconductor layer)
32 Hole (perforation hole)
33 Sacrificial layer
34 Metallic glass layer
34a Support portion
35 Cavity
35a Part of cavity
36 Diaphragm
40 Microphone
41 Base of package
42 Die
42a Substrate
43 Counter electrode
44 Diaphragm
45 Readout circuit
46 Wiring
50 Microphone
51 Base of package
51a Sound hole
51b Wiring
52 Die
52a Substrate
53 Counter electrode
54 Diaphragm
55 Readout circuit
56 Bump
57 Sealing material (resin)
60, 70, 80 Diaphragm
61, 71, 81 Slit

The invention claimed is:

1. A pressure sensor, comprising:
   a silicon substrate having a cavity;
   a diaphragm which is formed of a metallic glass and has a tensile stress in a range in which a resonant frequency is higher than an audible range; and
   a counter electrode insulated from the diaphragm and having a plurality of holes,
   wherein the diaphragm and the counter electrode are disposed on the silicon substrate to face each other with a gap therebetween, the diaphragm and the counter electrode being released from the silicon substrate by the cavity.

2. The pressure sensor according to claim 1,
   wherein the diaphragm is divided into a plurality of portions, and
   wherein each portion is supported in a cantilevered manner.

3. The pressure sensor according to claim 1, wherein a thickness of the diaphragm varies according to a location.

4. The pressure sensor according to claim 3, wherein the diaphragm has a thick portion and thin portions surrounding the thick portion, the thick portion forming a honeycomb shape, a lattice shape, a radial shape, or a combination thereof.

5. The pressure sensor according to claim 1, further comprising a readout circuit which reads out a vibration signal of the diaphragm, wherein the readout circuit and the diaphragm are provided on a die.

6. The pressure sensor according to claim 1, wherein the diaphragm has a tensile stress greater than 0 and no greater than 500 MPa.

7. The pressure sensor according to claim 1, further comprising a plurality of diaphragms, wherein 2 to 16 of the plurality of diaphragms are provided on a die.

8. The pressure sensor according to claim 1, wherein the metallic glass is one of a Zr-based metallic glass, a Pd-based metallic glass, a Pt-based metallic glass, an Au-based metallic glass, an Fe-based metallic glass, an Ni-based metallic glass, an Mg-based metallic glass, a Co-based metal glass, and a Cu-based metallic glass.

9. The pressure sensor according to claim 1, wherein the metallic glass includes one of Zr, Co, and CuZr as a main component.

10. A method of producing a pressure sensor according to claim 1, the method comprising:
    providing a plurality of holes in a layer to be the counter electrode;
    providing a sacrificial layer so as to fill the holes and be arranged on the layer to be the counter electrode;
    providing a metallic glass in the form of a layer on a part of the layer to be the counter electrode and the sacrificial layer;
    releasing the counter electrode, the sacrificial layer, and the metallic glass layer from the substrate by etching a back surface of the substrate; and
    removing the sacrificial layer.

11. The method according to claim 10, wherein the metallic glass is provided using a sputtering method.

12. The method according to claim 10, wherein the sacrificial layer is formed of a resin.

* * * * *